(12) United States Patent
Kuo et al.

(10) Patent No.: US 9,887,672 B1
(45) Date of Patent: Feb. 6, 2018

(54) DISTORTION COMPENSATION METHOD FOR CLASS-D AUDIO AMPLIFIER

(71) Applicants: NATIONAL CHENG KUNG UNIVERSITY, Tainan (TW); MEGAWIN TECHNOLOGY CO., LTD, Zhubei (TW)

(72) Inventors: Tai-Haur Kuo, Tainan (TW); Shih-Hsiung Chien, Tainan (TW); Jyun-Jia Huang, Tainan (TW)

(73) Assignees: National Cheng Kung University, Tainan (TW); Megawin Technology Co., Ltd., Zhubei (TW)

( * ) Notice: Subject to any disclaimer, the term of this patent is extended or adjusted under 35 U.S.C. 154(b) by 0 days.

(21) Appl. No.: 15/470,047

(22) Filed: Mar. 27, 2017

(51) Int. Cl.
- H03F 1/32 (2006.01)
- H03F 3/20 (2006.01)
- H03F 3/181 (2006.01)

(52) U.S. Cl.
CPC ............. *H03F 1/32* (2013.01); *H03F 3/181* (2013.01); *H03F 3/20* (2013.01); *H03F 2200/351* (2013.01); *H03F 2200/451* (2013.01)

(58) Field of Classification Search
CPC .................................................. H03F 1/32
USPC .......................... 330/149, 251, 207 A
See application file for complete search history.

(56) References Cited

U.S. PATENT DOCUMENTS

| | | | | |
|---|---|---|---|---|
| 5,510,753 | A * | 4/1996 | French | H03F 1/0227 330/10 |
| 6,728,368 | B1 * | 4/2004 | Mohajeri | H04L 27/0002 370/493 |
| 2006/0103458 | A1 * | 5/2006 | Hansen | H03F 3/211 330/10 |
| 2007/0057721 | A1 * | 3/2007 | Risbo | H03F 1/32 330/10 |
| 2007/0229155 | A1 * | 10/2007 | Adduci | H03F 1/32 330/251 |
| 2008/0211578 | A1 * | 9/2008 | Morishima | H02M 3/157 341/143 |
| 2016/0006402 | A1 * | 1/2016 | Kaya | H03F 1/32 330/251 |

\* cited by examiner

*Primary Examiner* — Patricia T Nguyen
(74) *Attorney, Agent, or Firm* — C. G. Mersereau; Nikolai & Mersereau, P.A.

(57) ABSTRACT

A distortion compensation method for a class-D audio amplifier has the steps of connecting a compensation circuit to the class-D audio amplifier; providing a feed-forward signal from the compensation circuit to the loop filter, wherein the feed-forward signal contains replicate high-frequency components replicated from original high-frequency components of the class-D audio amplifier; and adding the feed-forward signal to those of the class-D audio amplifier. By adding the feed-forward signal, PWM-intermodulated distortion resulted from the high-frequency components is reduced. The class-D audio amplifier still maintains loop stability without affecting its phase margin.

6 Claims, 9 Drawing Sheets

DISTORTION COMPENSATION METHOD FOR CLASS-D AUDIO AMPLIFIER

BACKGROUND OF THE INVENTION

1. Field of the Invention

The present invention relates to a distortion compensation method for a class-D audio amplifier, and more particularly to a distortion compensation method using an extra-added feed-forward signal to reduce PWM-intermodulated distortion of a class-D audio amplifier.

2. Description of the Prior Art

Audio amplifier ICs usually require high efficiency, and class-D audio amplifiers can meet this requirement. For many high-quality applications, superior audio performance is demanded, and distortions of such class-D audio amplifiers would be a serious concern.

With reference to FIG. 8, a conventional open-loop class-D amplifier for driving a load comprises a pulse-width-modulation (PWM) generator 81, a power stage 82 and an optional LC filter 83. The PWM generator 81 generates a PWM signal by comparing an audio signal with a triangular wave. Due to the inherent PWM property, the generated PWM signal contains the audio signal and large high-frequency components HF. The power stage 82 uses the PWM signal to drive the load.

With reference to FIG. 9, a conventional closed-loop class-D audio amplifier has elements similar to the open-loop class-D audio amplifier mentioned above and further has a loop filter 91, wherein the power stage 93 has its output connecting to an input of the loop filter 91 to form a feedback path. The in-band harmonic distortion components at the output of the power stage 93 are fed back and processed by the loop filter 91 with high in-band gain; then, the output of the PWM generator 92 can be correspondingly adjusted to suppress the in-band harmonic distortion components, where the in-band distortion suppression capability increases with the increasing in-band loop gain. However, in addition to the in-band harmonic distortion components, the PWM high-frequency components HF at the output of the power stage 93 are also fed back into the loop. Such unwanted high-frequency components HF should be filtered by the loop filter 91 with high out-of-band attenuation. Nevertheless, if the out-of-band loop attenuation is insufficient, the residuals of high-frequency components HF will intermodulate with the triangular wave of the PWM generator 92. Subsequently, the intermodulation products will alias back into the audio band, resulting in the PWM-intermodulated distortion at the output of the power stage 93. To further reduce the PWM-intermodulated distortion, the out-of-band loop attenuation of the original loop gain design in FIG. 10 can be increased by designing the loop filter to obtain a shifted loop gain design in FIG. 10; however, its in-band loop gain is decreased. Hence, the THD+N is usually limited by the trade-off between high in-band loop gain and high out-of-band loop attenuation.

SUMMARY OF THE INVENTION

The objective of the present invention is to provide a distortion compensation method for a class-D audio amplifier for reducing the PWM-intermodulated distortion without degrading the loop stability of the class-D audio amplifier.

The class-D audio amplifier has a main loop formed by a loop filter, a PWM generator, a power stage, and an optional LC filter sequentially connected, and a feedback path is established from the output of the power stage to an input of the loop filter. The distortion compensation method of the present invention has the steps of:

providing a feed-forward signal from a compensation circuit to the loop filter, wherein the feed-forward signal contains replicate high-frequency components replicated from original high-frequency components existing in the main loop of the class-D audio amplifier; and adding the feed-forward signal to the main loop of the class-D audio amplifier.

The compensation circuit provides a feed-forward signal carrying replicate high-frequency components to cancel those in the class-D audio amplifier. As a result, the PWM-intermodulated distortions resulted from the original high-frequency components of the class-D audio amplifier can be reduced. Further, total harmonic distortion plus noise (THD+N) is improved. The class-D audio amplifier still maintains its loop stability without affecting its phase margin.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
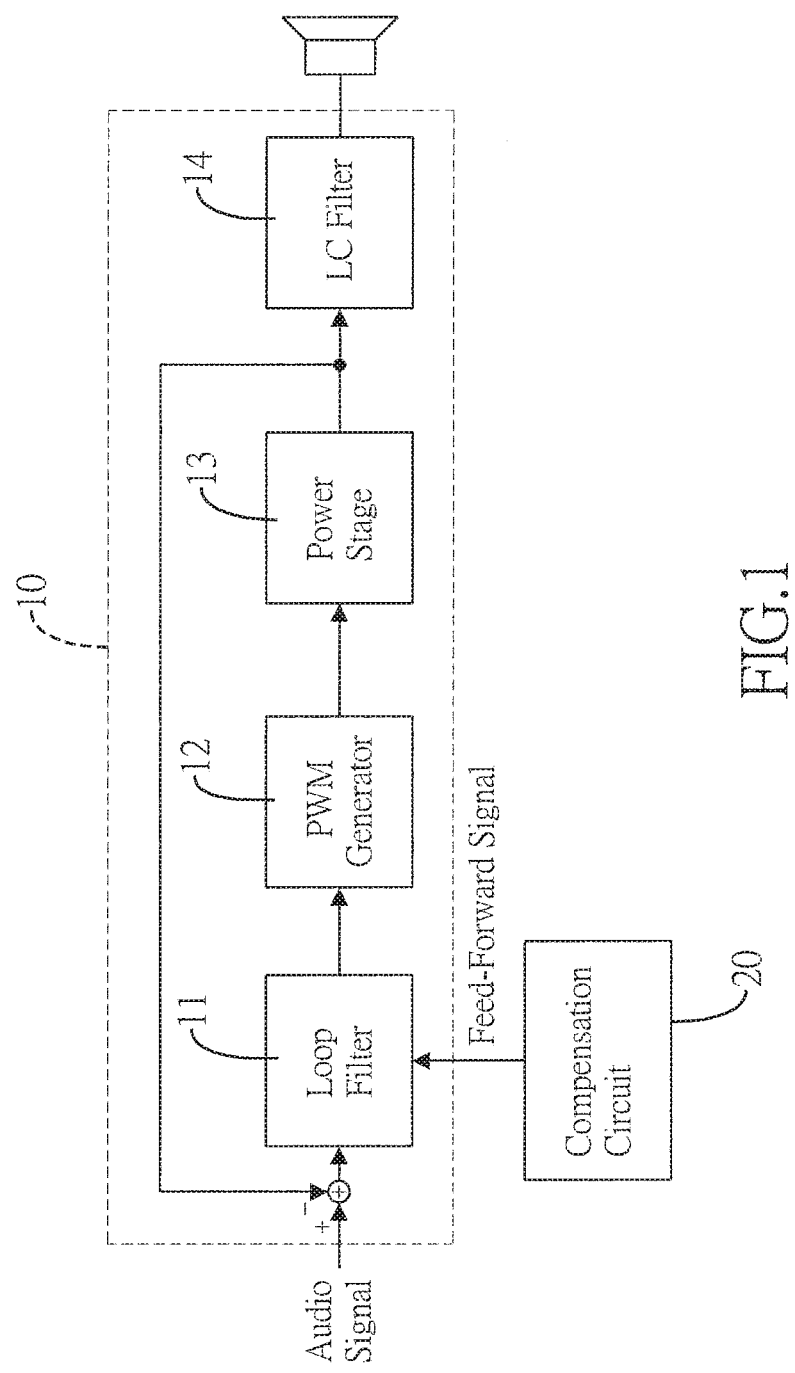
FIG. 1 is a circuit block diagram of a class-D audio amplifier with a compensation circuit for implementing the compensation method of the present invention.

With reference to FIG. 1, the present invention proposes a distortion compensation method for a class-D audio amplifier 10, which has a main loop formed by a loop filter 11, a pulse-width-modulation (PWM) generator 12, a power stage 13 and an optional LC filter 14. A feedback path is established from the output of the power stage 13 to an input of the loop filter 11. As described above, the high-frequency components generated by the PWM generator 12, the original high-frequency components hereinafter, will return to the input of the loop filter 11 via the feedback path and become a part of an input signal of the loop filter 11. Such high-frequency components may cause PWM-intermodulated distortion in the class-D audio amplifier 10.

To compensate or reduce the original high-frequency components existing in the class-D amplifier 10, a compensation circuit 20 is connected to the loop filter 11 and outputs a feed-forward signal to the loop filter 11. The feed-forward signal itself carries analogue high-frequency components similar to the original high-frequency components at around switching frequency and its harmonics. By adding the feed-forward signal to cancel the original high-frequency components from negative feedback, the PWM-intermodulated distortion of the class-D audio amplifier 10 will be effectively reduced.

Figure 2:
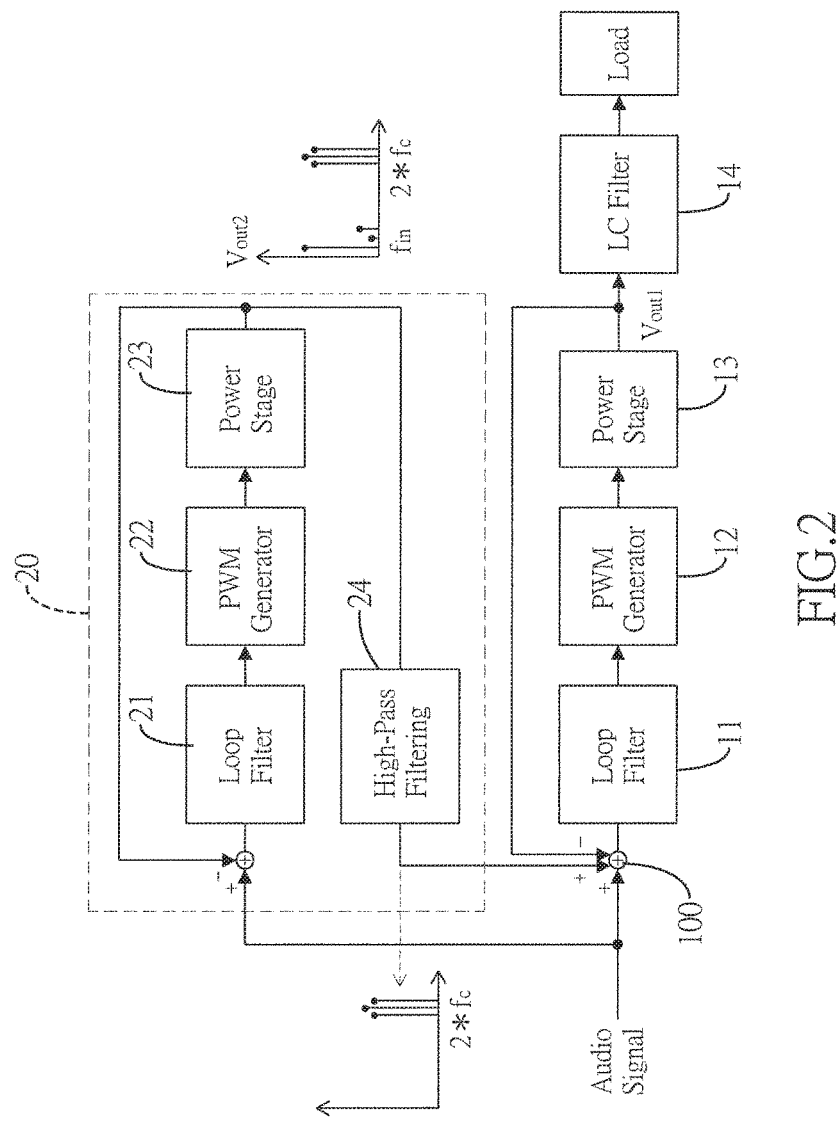
FIG. 2 shows a first embodiment of the compensation circuit in FIG. 1 of the present invention.

With reference to FIG. 2, a first embodiment of the compensation circuit 20 is shown. The compensation circuit 20 generates an analogue signal $V_{out2}$ similar to an output signal $V_{out1}$ of the power stage 13 of the class-D audio amplifier 10, and filters the analogue signal $V_{out2}$ by high-pass filtering 24 to keep the high-frequency components. In more detail, the compensation circuit 20 comprises a replica unit and the high-pass filtering 24. The replica unit has a loop filter 21, a PWM generator 22 and a power stage 23 all respectively duplicated from the loop filter 11, the PWM generator 12 and the power stage 13 of the class-D audio amplifier 10 and connected in the same configuration. Therefore, the analogue signal $V_{out2}$ will include the analogue high-frequency components similar to the original high-frequency components existing in the class-D audio amplifier 10.

With the high-pass filtering 24, only the analogue high-frequency components from the replica unit are allowed to enter the class-D audio amplifier 10. The feed-forward signal containing the analogue high-frequency components is added to a summing node 100 in the main loop of the class-D audio amplifier 10 to cancel the original high-frequency components of $V_{out1}$ from negative feedback. In this embodiment, the feed-forward signal is added to the input of the loop filter 11.

Figure 3:
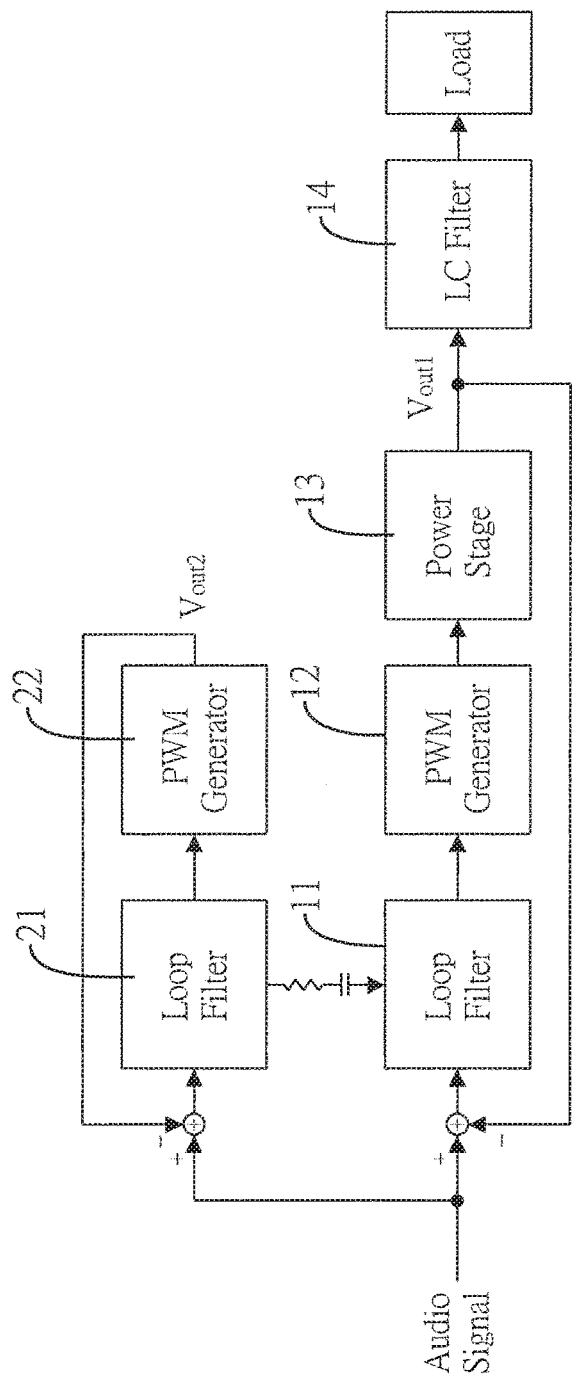
FIG. 3 shows a second embodiment of the compensation circuit in FIG. 1 of the present invention.

With reference to FIG. 3, a second embodiment of the compensation circuit 20 is shown. The compensation circuit 20 comprises a loop filter 21 and a PWM generator 22 respectively duplicated from the loop filter 11 and the PWM generator 12 of the class-D audio amplifier 10 and connected in the same configuration. Therefore, an analogue signal $V_{out2}$ of the PWM generator 22 will contain the analogue high-frequency components similar to the original high-frequency components existing in the class-D audio amplifier 10.

Figure 4:
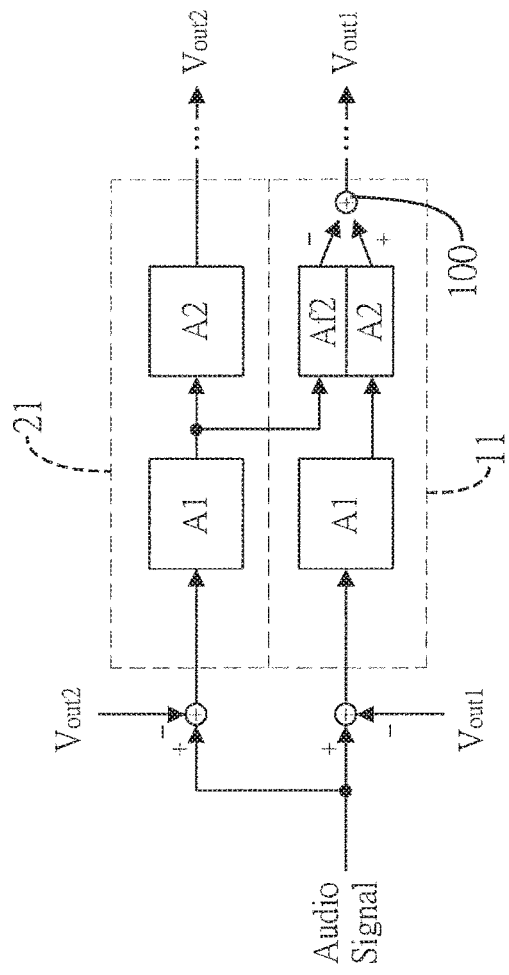
FIG. 4 shows transfer function blocks of two filters shown in FIG. 3.
Figure 5:
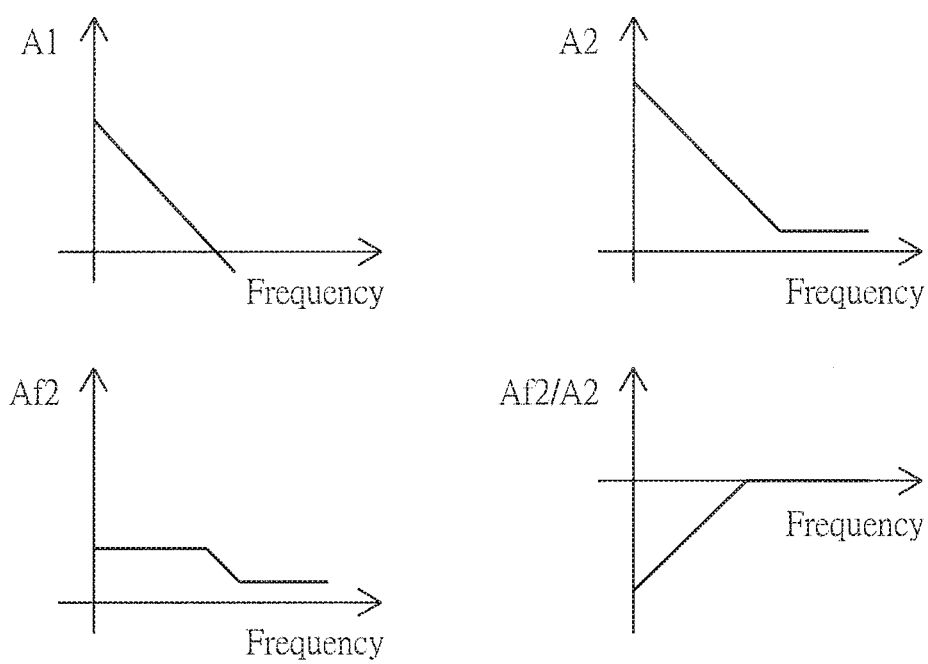
FIG. 5 shows transfer functions of the two filters shown in FIG. 4.

With further reference to FIG. 4, the two loop filters 11 and 21 can be expressed by their transfer function blocks. Each loop filter 11 and 21 comprises two stages. For the loop filter 21 of the compensation circuit 20, the first stage and the second stage use respective transfer functions A1 and A2 as shown in FIG. 5 to process the audio signal. For the loop filter 11 of the class-D audio amplifier 10, the first stage and the second stage use respective transfer functions A1 and A2 as shown in FIG. 5 to process the audio signal. However, the signal output from the first stage of the loop filter 21, i.e. the feed-forward signal, will be further input to the second stage of the loop filter 11 and processed by a new transfer function Af2 instead of the original transfer function A2, where A2 is the transfer function from the original signal of the main loop to the summing node of the main loop, and Af2 means the transfer function from the analogue signal of the compensation circuit 20 to the summing node of the main loop. Consequently, the loop filter 11 of the class-D audio amplifier 10 provides a transfer function Af2/A2 as shown in FIG. 5 to realize high-pass filtering. The transfer function Af2/A2 is an equivalent high-pass filtering without additional operational amplifiers OPs to save chip area and power consumption.

Figure 6:
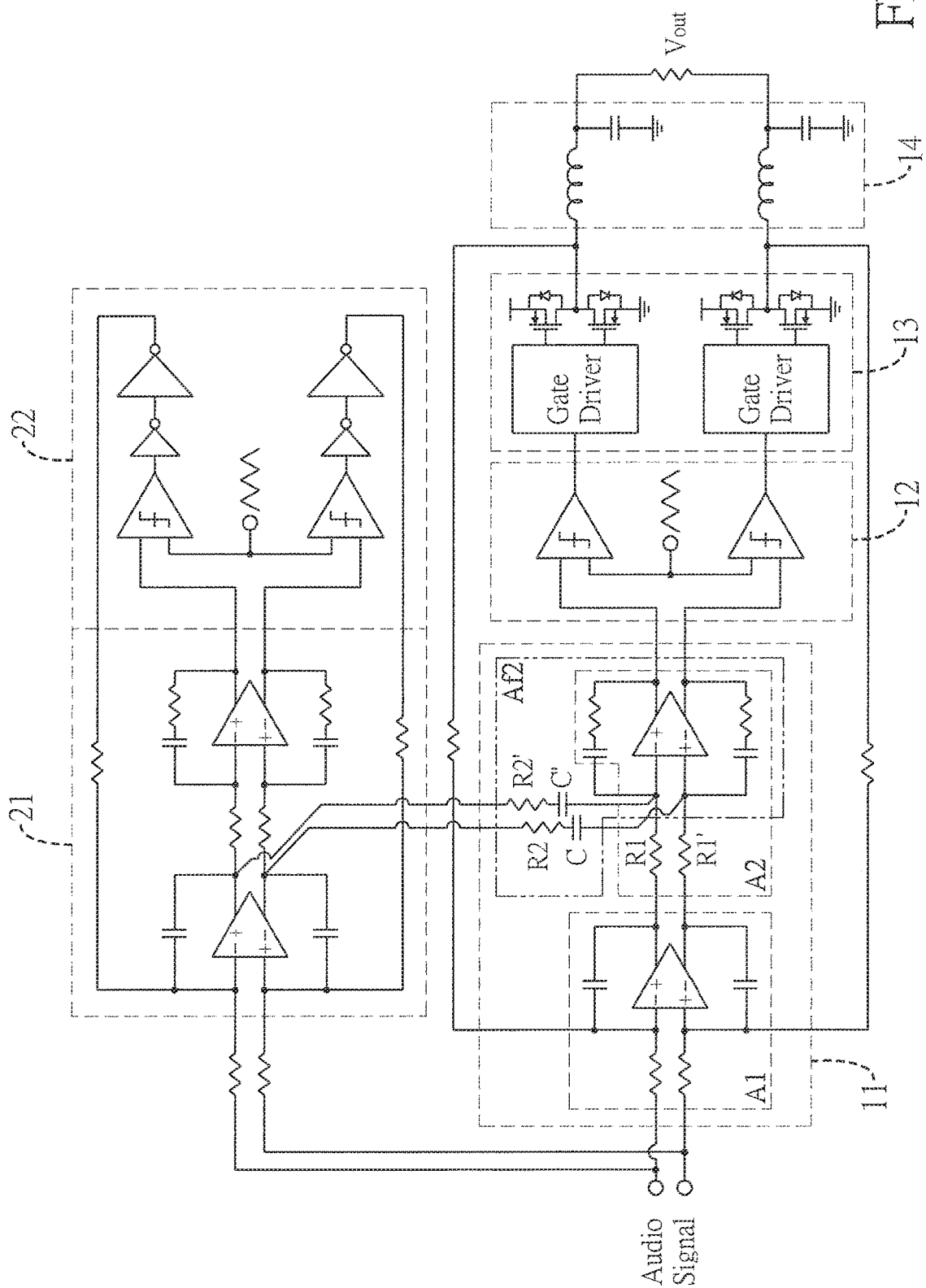
FIG. 6 is a detailed circuit diagram of FIG. 3.

With reference to FIG. 6, a detailed circuit diagram of the compensation circuit 20 of FIG. 3 is shown. In the loop filter 11 of the class-D audio amplifier 10, the signal output from the first stage is input to an operational amplifier OP of the second stage through resistors R1, R1'. The two resistors R1, R1', and the amplifier OP accompanied by other elements collectively determine the transfer function A2. In another aspect, the feed-forward signal from the first stage of the loop filter 21 of the compensation circuit 20 is input to the same operational amplifier OP through resistors R2, R2' and capacitors C, C'. The resistors R2, R2', the capacitors C, C' and the amplifier OP accompanied by other elements collectively determine the transfer function Af2. In the embodiment of FIG. 6, the high-pass filtering is implemented with a part of circuit, i.e. the elements within the block representing the transfer function A2, sharing with the main loop.

Figure 7:
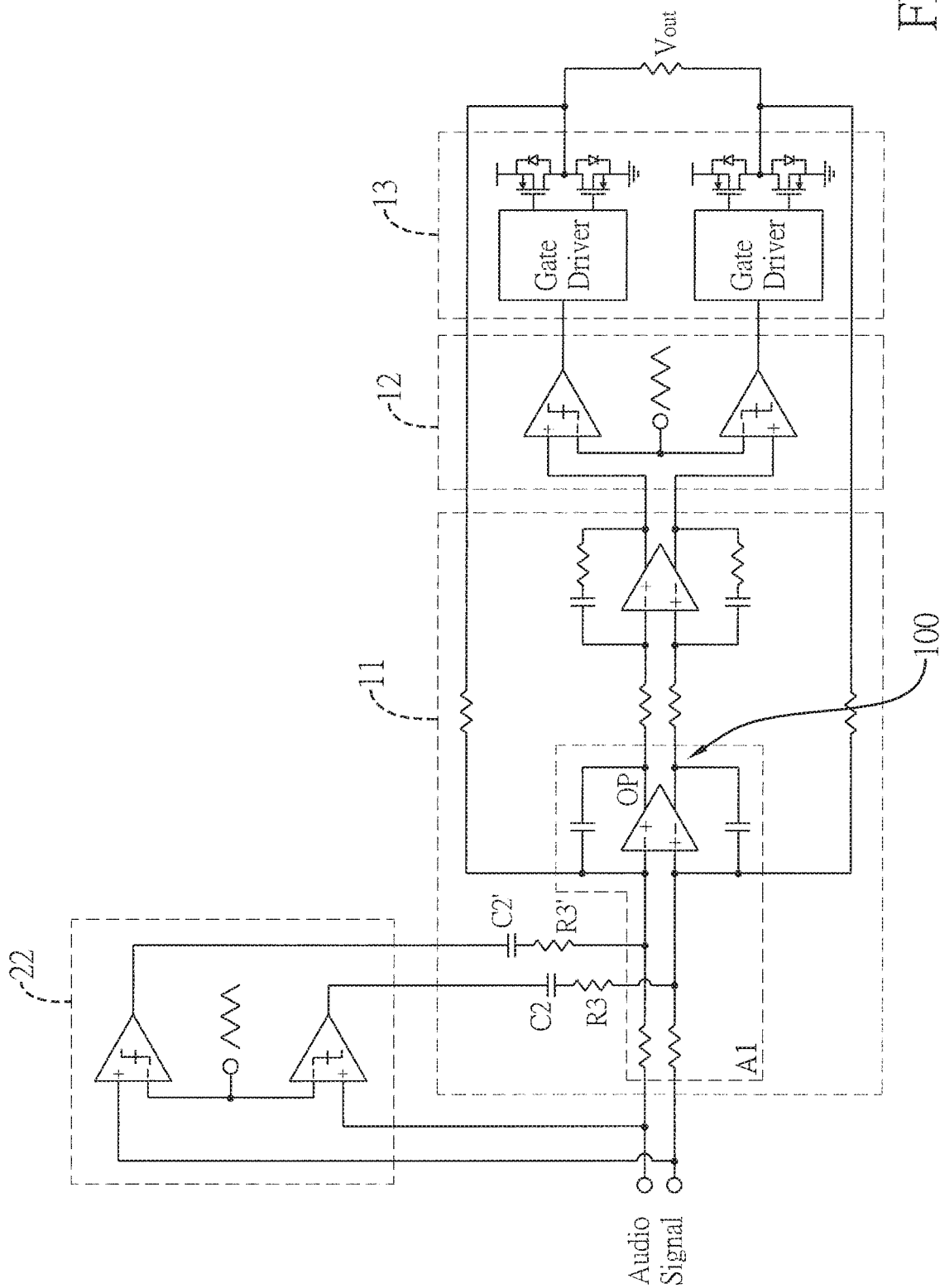
FIG. 7 shows a third embodiment of the compensation circuit in FIG. 1 of the present invention.
Figure 8:
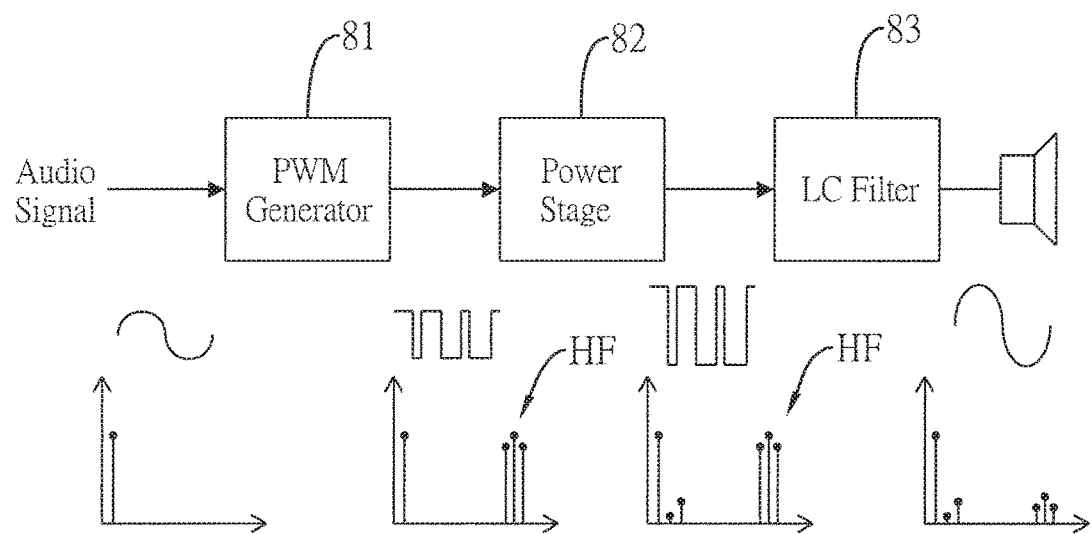
FIG. 8 is a circuit block diagram of a conventional open-loop class-D audio amplifier.
Figure 9:
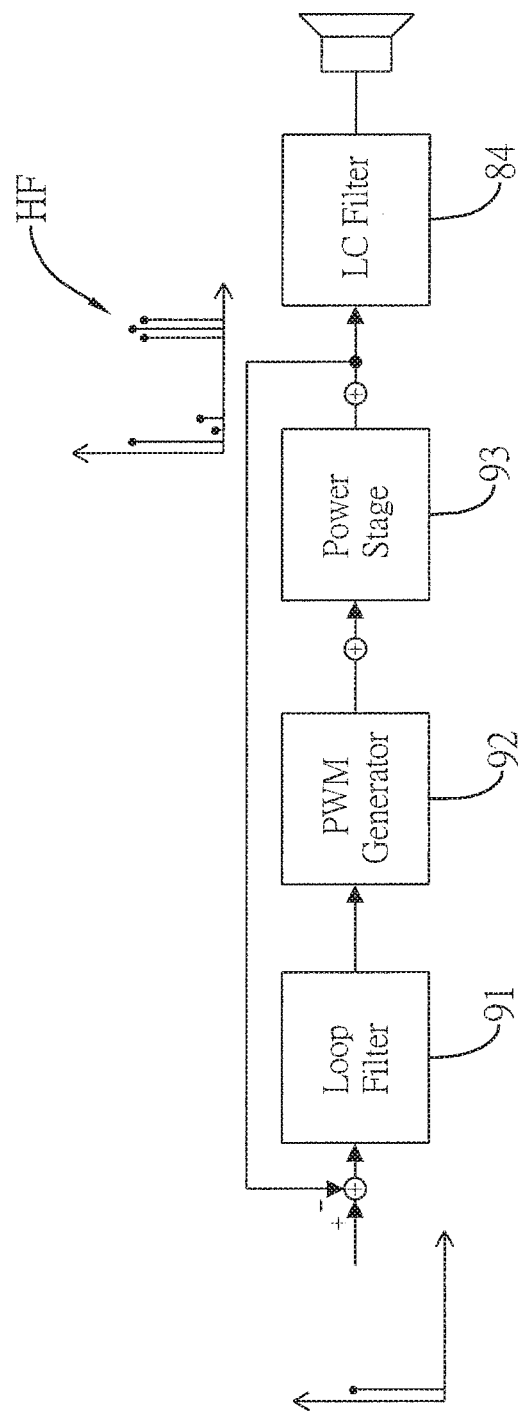
FIG. 9 is circuit block diagram of a conventional closed-loop class-D audio amplifier.
Figure 10:
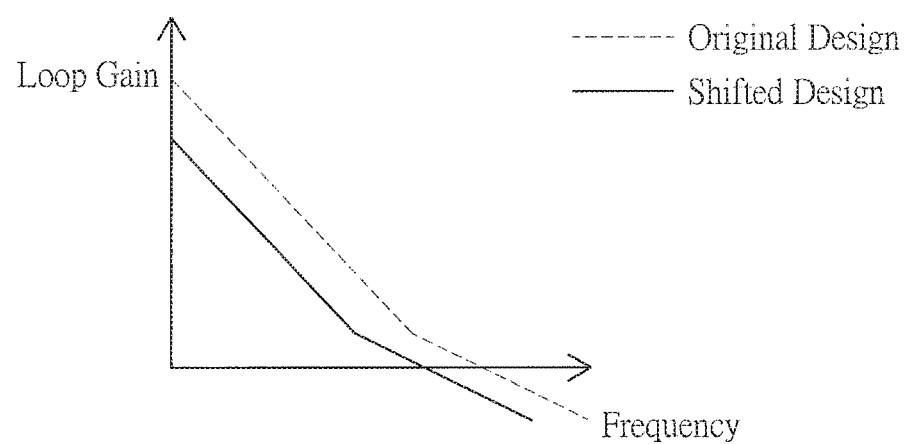
FIG. 10 shows two different loop gain designs of the class-D audio amplifier.

With reference to FIG. 7, a detailed circuit diagram of a third embodiment of the compensation circuit 20 is shown. This compensation circuit 20 comprises a PWM generator 22 duplicated from the PWM generator 12. The PWM generator 22 generates the feed-forward signal and then input to the input of the first operational amplifier OP in loop filter 11 via two resistors R3, R3' and two capacitors C2, C2'. In this embodiment, the summing node 100 is the input of the first operational amplifier OP in loop filter 11. In the embodiment of FIG. 7, the high-pass filtering is implemented with a part of circuit, i.e. the elements within the block representing the transfer function A1, sharing with the main loop.

In the present invention, the compensation circuit 20 provides a feed-forward signal carrying high-frequency components to cancel those in the class-D audio amplifier. As a result, the invention significantly improves the total harmonic distortion plus noise (THD+N) and maintains the stability of the class-D audio amplifier since the PWM-intermodulated distortions are suppressed by the feed-forward signal.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A distortion compensation method for a class-D audio amplifier, wherein the class-D audio amplifier has a main loop formed by a loop filter, a PWM generator, a power stage, and an optional LC filter sequentially connected, and a feedback path is established from the output of the power stage to an input of the loop filter, the method comprising the steps of:

providing a feed-forward signal from a compensation circuit, wherein the feed-forward signal contains analogue high-frequency components similar to the original high-frequency components at around switching frequency and its harmonics existing in the main loop of the class-D audio amplifier; and adding the feed-forward signal to a summing node in the main loop of the class-D audio amplifier.

2. The method as claimed in claim 1, wherein the step of providing the feed-forward signal further comprises:

generating an analogue signal similar to an original signal in the main loop of the class-D audio amplifier; and high-pass filtering the analogue signal to extract the analogue high-frequency components similar to the original high-frequency components at around switching frequency and its harmonics.

3. The method as claimed in claim 2, wherein the step of high-pass filtering is realized by an actual high-pass filtering of a transfer function from the analogue signal of the compensation circuit to the summing node of the main loop.

4. The method as claimed in claim 2, wherein the step of high-pass filtering is realized by an equivalent high-pass filtering of a transfer function Af2/A2, where Af2 is a first transfer function from the analogue signal of the compensation circuit to the summing node of the main loop, and A2 is a second transfer function from the original signal of the main loop to the summing node of the main loop.

5. The method as claimed in claim 2, wherein the step of high-pass filtering is implemented by an additional high-pass filter.

6. The method as claimed in claim 2, wherein the step of high-pass filtering is implemented with a part of circuit of the main loop.

* * * * *